United States Patent
Park et al.

(10) Patent No.: US 10,174,222 B2
(45) Date of Patent: Jan. 8, 2019

(54) FLEXIBLE DISPLAY DEVICE AND METHOD FOR PREPARING HARD COATING POLYMER OF SAME

(71) Applicant: Samsung Display Co., Ltd., Yongin-si, Gyeonggi-do (KR)

(72) Inventors: Youngsang Park, Seoul (KR); Inseo Kee, Asan-si (KR); Jihyuk Im, Yongin-si (KR); Chulho Jeong, Seoul (KR)

(73) Assignee: Samsung Display Co., Ltd., Yongin-si (KR)

( * ) Notice: Subject to any disclaimer, the term of this patent is extended or adjusted under 35 U.S.C. 154(b) by 177 days.

(21) Appl. No.: 15/232,740

(22) Filed: Aug. 9, 2016

(65) Prior Publication Data
US 2017/0233606 A1 Aug. 17, 2017

(30) Foreign Application Priority Data

Feb. 15, 2016 (KR) .......................... 10-2016-0017355

(51) Int. Cl.
| | | |
|---|---|---|
| *C09D 183/04* | (2006.01) | |
| *H01L 51/00* | (2006.01) | |
| *H01L 51/52* | (2006.01) | |
| *H01L 27/32* | (2006.01) | |

(52) U.S. Cl.
CPC .......... *C09D 183/04* (2013.01); *H01L 27/323* (2013.01); *H01L 27/3244* (2013.01); *H01L 51/0094* (2013.01); *H01L 51/0097* (2013.01); *H01L 51/5256* (2013.01); *H01L 51/0035* (2013.01); *H01L 51/0043* (2013.01); *H01L 2251/5338* (2013.01)

(58) Field of Classification Search
None
See application file for complete search history.

(56) References Cited

U.S. PATENT DOCUMENTS

| | | | | |
|---|---|---|---|---|
| 5,776,998 A | * | 7/1998 | Southwick | ............... C08J 3/201 522/111 |
| 6,649,668 B1 | * | 11/2003 | David | ..................... C07F 5/027 522/148 |
| 7,300,619 B2 | * | 11/2007 | Napadensky | ........... B29C 64/40 264/401 |
| 7,452,585 B1 | * | 11/2008 | Wong | ........................ C08J 9/00 264/176.1 |

(Continued)

FOREIGN PATENT DOCUMENTS

| | | |
|---|---|---|
| KR | 10-2015-0029560 | 3/2015 |
| KR | 10-1600390 B1 | 3/2016 |

(Continued)

*Primary Examiner* — Peter A Salamon
(74) *Attorney, Agent, or Firm* — Lewis Roca Rothgerber Christie LLP

(57) ABSTRACT

A flexible display device includes a hard coating layer, the hard coating layer including hard coating oligomers, cross-linking oligomers that couple the hard coating oligomers, and a photoinitiator, the cross-linking oligomers being synthesized by catalytically reacting cross-linking monomers. The hard coating layer may include long cross-linking oligomers that improve the flexibility of the hard coating layer, and damage to the hard coating layer may be prevented or reduced even when the flexible display device is bent.

14 Claims, 14 Drawing Sheets

(56) References Cited

U.S. PATENT DOCUMENTS

| | | | |
|---|---|---|---|
| 2002/0008333 A1* | 1/2002 | Napadensky | B41M 3/006 264/401 |
| 2003/0107158 A1* | 6/2003 | Levy | B29C 67/24 264/494 |
| 2003/0207959 A1* | 11/2003 | Napadensky | B29C 67/0059 522/183 |
| 2005/0214530 A1* | 9/2005 | Tanaka | B32B 27/06 428/347 |
| 2005/0253119 A1* | 11/2005 | Araki | C07D 231/38 252/582 |
| 2011/0118374 A1* | 5/2011 | Schneider | C08F 2/50 522/25 |
| 2012/0178845 A1* | 7/2012 | Napadensky | B29C 67/0059 522/96 |
| 2013/0083496 A1 | 4/2013 | Franklin et al. | |
| 2014/0065326 A1 | 3/2014 | Lee et al. | |
| 2015/0246387 A1* | 9/2015 | Bartels | B22C 1/181 164/22 |
| 2017/0244052 A1* | 8/2017 | Park | C09D 183/06 |

FOREIGN PATENT DOCUMENTS

| | | | |
|---|---|---|---|
| KR | 10-2017-0096280 | 8/2017 | |
| WO | WO-2006073021 A1 * | 7/2006 | C08F 2/50 |

* cited by examiner

FLEXIBLE DISPLAY DEVICE AND METHOD FOR PREPARING HARD COATING POLYMER OF SAME

CROSS-REFERENCE TO RELATED APPLICATION

This application claims priority to and the benefit of Korean Patent Application No. 10-2016-0017355, filed on Feb. 15, 2016, the entire contents of which are incorporated herein by reference.

BACKGROUND

1. Field

Embodiments of the present disclosure herein relate to a flexible display device, for example, to a flexible display device having a hard coating layer.

2. Description of Related Art

Electronic devices such as smartphones, digital cameras, notebook computers, navigation systems, and smart televisions are being developed. Such electronic devices are equipped with display devices for providing information.

As electronic devices evolve into various forms, display devices are also correspondingly changing. Electronic devices have been equipped with flat display devices. Recently developed electronic devices require flexible display devices such as curved, bendable, and rollable types (rollable kinds of devices).

In addition, consumers demand thin electronic devices. In order to achieve such thin electronic devices, various functional members are being integrated into display devices.

SUMMARY

Aspects of embodiments of the present disclosure are directed toward a flexible display device that has improved hardness and flexibility.

Moreover, aspects of embodiments of the present disclosure are directed toward a method for preparing a hard coating polymer that has improved hardness and flexibility.

An embodiment of the present disclosure provides a display device including a flexible display panel which generates images; and a window member on the flexible display panel. The window member includes a base member and a hard coating layer on the base member. The hard coating member may contain a photoinitiator and a polymer represented by Formula 5.

[Formula 5]

In Formula 1, X may be represented by Formula 1.

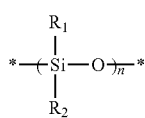

[Formula 1]

In Formula 1, n is from 8 to 150, $R_1$ is one of a hydroxy group, a substituted or unsubstituted aryl group having from 6 to 30 carbon atoms for forming a ring, an alkoxy group, a substituted or unsubstituted alkyl group having from 1 to 20 carbon atoms, or a photoinitiated reactive group, at least one of the plurality of $R_1$s being a photoinitiated reactive group, and $R_2$ may be one of a hydroxy group, a substituted or unsubstituted aryl group having from 6 to 30 carbon atoms for forming a ring, an alkoxy group, a substituted or unsubstituted alkyl group having from 1 to 20 carbon atoms, or a photoinitiated reactive group.

In Formula 5, Y may be represented by Formula 10.

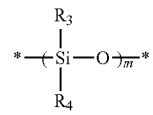

[Formula 10]

In Formula 10, m is from 8 to 150, $R_3$ is one of a hydroxy group, a substituted or unsubstituted aryl group having from 6 to 30 carbon atoms for forming a ring, an alkoxy group, a substituted or unsubstituted alkyl group having from 1 to 20 carbon atoms, or a photoinitiated reactive group, at least one of the plurality of $R_3$s being a photoinitiated reactive group, and $R_4$ may be one of a hydroxy group, a substituted or unsubstituted aryl group having from 6 to 30 carbon atoms for forming a ring, an alkoxy group, a substituted or unsubstituted alkyl group having from 1 to 20 carbon atoms, or a photoinitiated reactive group.

In Formula 1, Z may be represented by Formula 4.

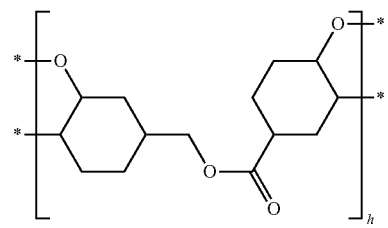

[Formula 4]

In Formula 4, h is from 2 to 20.

In an embodiment, at least one of the plurality of $R_1$s or at least one of the plurality of $R_3$s may be an ester group substituted with a substituent including an epoxy group or an alkenyl group, an alkyl group having from 1 to 20 carbon atoms and substituted with a substituent including an epoxy group or an alkenyl group, or a substituted or unsubstituted alkenyl group having from 1 to 20 carbon atoms.

In an embodiment, each of $R_1$ and $R_3$ may be represented by one of Formula 5 or Formula 6.

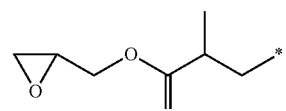

[Formula 5]

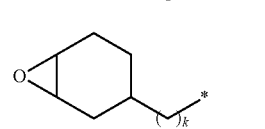

[Formula 6]

In Formula 6, k is from 1 to 10.

In an embodiment, the hard coating layer may further include silicon nanoparticles.

In an embodiment, the hard coating layer may further include a bisphenol-A-epoxy-silicone block copolymer.

In an embodiment, the photoinitiator may include a first photoinitiator and a second photoinitiator, where the first photoinitiator may be initiated by light having a wavelength different from that of light that initiates the second photoinitiator (e.g., which are initiated by light of different wavelengths from each other).

In an embodiment of the present disclosure, a method for preparing a hard coating polymer includes synthesizing hard coating oligomers; synthesizing cross-linking oligomers; and synthesizing a hard coating polymer by providing a photoinitiator and photoreacting the hard coating oligomers and the cross-linking oligomers. Each of the hard coating oligomers may be represented by the below Formula 1, and each of the cross-linking oligomers may be represented by the below Formula 2.

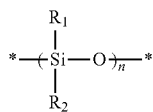

[Formula 1]

In the above Formula 1, n is from 8 to 150, $R_1$ is one of a hydroxy group, a substituted or unsubstituted aryl group having from 6 to 30 carbon atoms for forming a ring, an alkoxy group, a substituted or unsubstituted alkyl group having from 1 to 20 carbon atoms, or a photoinitiated reactive group, at least one of the plurality of $R_1$s being a photoinitiated reactive group, and $R_2$ may be one of a hydroxy group, a substituted or unsubstituted aryl group having from 6 to 30 carbon atoms for forming a ring, an alkoxy group, a substituted or unsubstituted alkyl group having from 1 to 20 carbon atoms, or a photoinitiated reactive group.

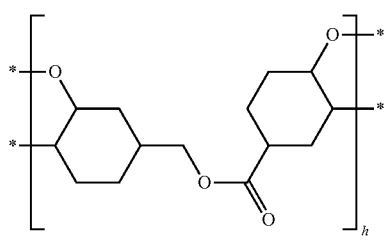

[Formula 2]

In the above Formula 2, h is from 2 to 20.

In an embodiment, in the synthesizing of the hard coating oligomers, the hard coating oligomers may be synthesized by catalytically reacting hard coating monomers. In the synthesizing of the cross-linking oligomers, the cross-linking oligomers may be synthesized by catalytically reacting cross-linking monomers.

In an embodiment, the same catalyst may be used for the synthesizing of the hard coating oligomers and the synthesizing of the cross-linking oligomers.

In an embodiment, the catalyst may include $Ba(OH)_2 \cdot H_2O$.

In an embodiment, the photoinitiator may include a first photoinitiator and a second photoinitiator, where the first photoinitiator may be activated by a first light having a wavelength different from that of a second light that initiates the second photoinitiator (e.g., which are initiated by light of different wavelengths from each other). The synthesizing of the hard coating polymer may include emitting a first light that activates the first photoinitiator and emitting a second light that activates the second photoinitiator.

In an embodiment, with respect to 100 wt % of the hard coating polymer, the hard coating oligomers may be 70 wt % to 90 wt %, the cross-linking oligomers may be 10 wt % to 20 wt %, and the photoinitiator may be 1 wt % to 4 wt %.

In an embodiment, the synthesizing of the hard coating oligomers may include preparing a hard coating solution including hard coating monomers and a solvent; and providing the hard coating solution with a catalyst to synthesize the hard coating oligomers.

In an embodiment, the synthesizing of the cross-linking oligomers may include providing cross-linking monomers to the hard coating solution in which the hard coating oligomers are synthesized.

In an embodiment, the synthesizing of the cross-linking oligomers may include preparing a cross-linking solution including cross-linking monomers and a solvent; and providing the cross-linking solution with a catalyst to synthesize the cross-linking oligomers.

In an embodiment, the synthesizing of the hard coating oligomers may include providing hard coating monomers to the cross-linking solution in which the cross-linking oligomers are synthesized.

In an embodiment, the synthesizing of the hard coating oligomers may include preparing a hard coating solution including hard coating monomers and a first solvent; and providing the hard coating solution with a first catalyst to synthesize the hard coating oligomers.

In an embodiment, the synthesizing of the cross-linking oligomers may include preparing a cross-linking solution including cross-linking monomers and a second solvent; and providing the cross-linking solution with a second catalyst to synthesize the cross-linking oligomers.

In an embodiment, each of the first solvent and the second solvent may include a ketone-based solvent or an ether-based solvent.

In an embodiment, the first catalyst and the second catalyst may be the same catalyst.

BRIEF DESCRIPTION OF THE FIGURES

FIG. 2A is a cross-sectional view according to a first operation of a flexible display device according to an embodiment of the;

DETAILED DESCRIPTION

Hereinafter, embodiments of the present disclosure will be described in more detail with reference to the accompanying drawings. It will be understood that when an element (or area, layer, portion, etc.) is referred to as being "on", "connected to" or "coupled to" another element, it can be directly on, connected or coupled to the other element or intervening elements may be present.

Like numbers refer to like elements throughout. The thickness and the ratio and the dimension of the element may be exaggerated for ease of description of the technical features. As used herein, the term "and/or" includes any and all combinations of one or more of the associated listed items.

It will be understood that, although the terms "first," "second," etc. may be used herein to describe various elements, these elements should not be limited by these terms. These terms are only used to distinguish one element from another element. Thus, a first element discussed below could be termed a second element without departing from the spirit and scope of the present disclosure. Similarly, a second element could be termed a first element. Singular forms are intended to include the plural forms as well, unless the context clearly indicates otherwise.

Moreover, spatially relative terms, such as "beneath", "below", "lower", "above", "upper" and the like, may be used herein for ease of description to describe one element's relationship to another element(s) as illustrated in the figures. It will be understood that the spatially relative terms are intended to encompass different orientations of the device in use or in operation, in addition to the orientation depicted in the figures. For example, if the device in the figures is turned over, elements described as "below" or "beneath" or "under" other elements or features would then be oriented "above" the other elements or features. Thus, the example terms "below" and "under" can encompass both an orientation of above and below. The device may be otherwise oriented (e.g., rotated 90 degrees or at other orientations) and the spatially relative descriptors used herein should be interpreted accordingly.

It will be further understood that the terms "includes" and/or "including", when used in this disclosure, specify the presence of stated features, integers, acts, operations, elements, and/or components, but do not preclude the presence or addition of one or more other features, integers, acts, operations, elements, components, and/or groups thereof.

Figure 1A:
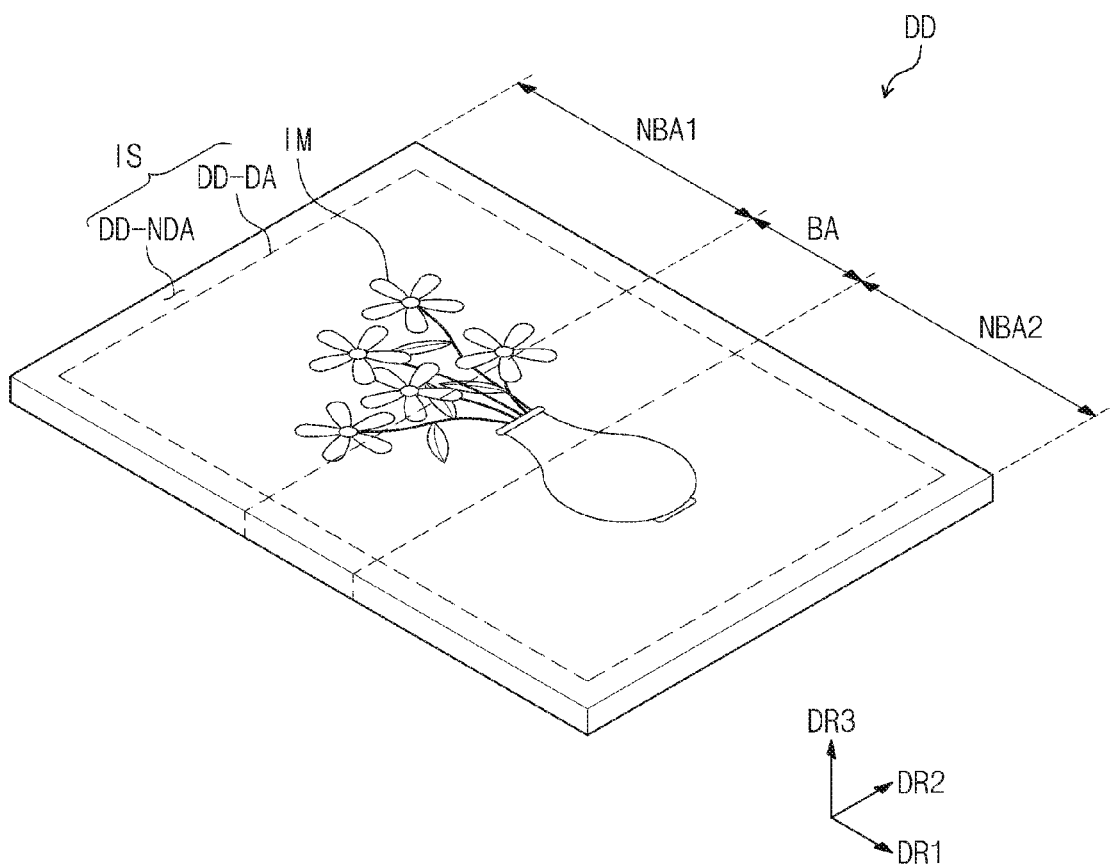
FIG. 1A is a perspective view according to a first operation of a flexible display device according to an embodiment of the present disclosure.
Figure 1B:
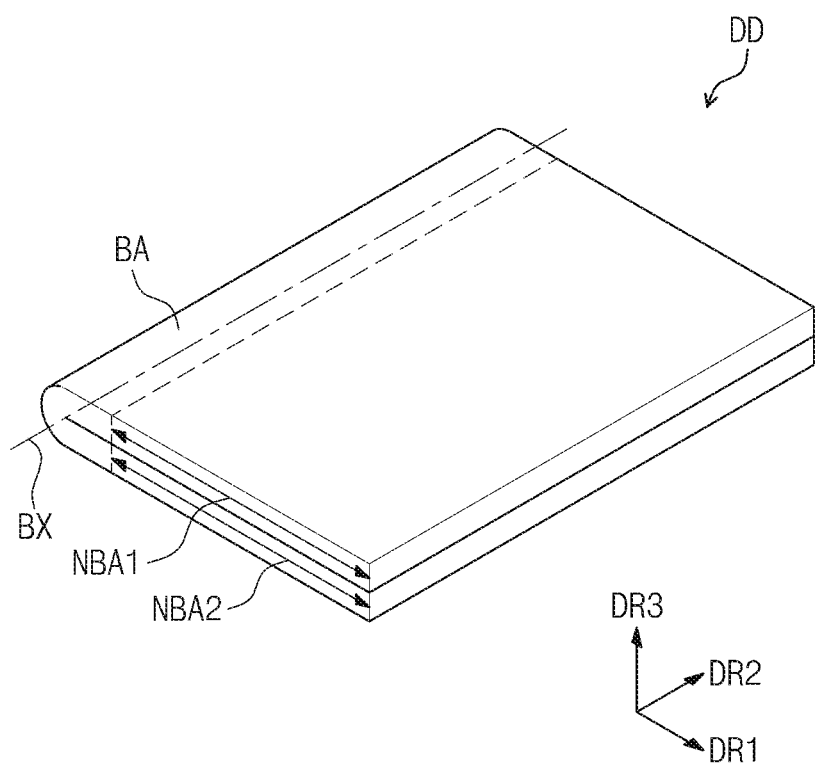
FIG. 1B is a perspective view according to a second operation of a flexible display device according to an embodiment of the present disclosure.
Figure 2A:
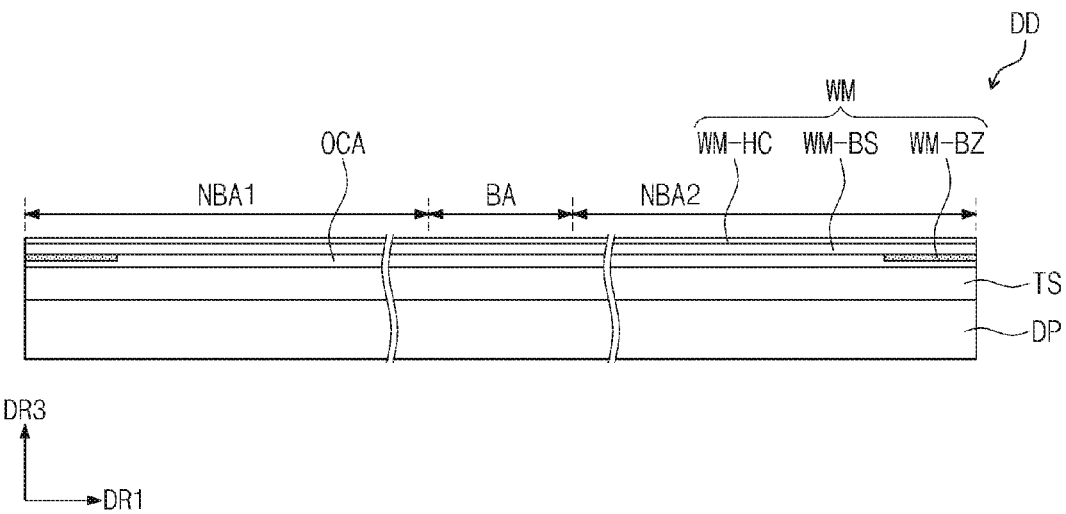
Figure 2B:
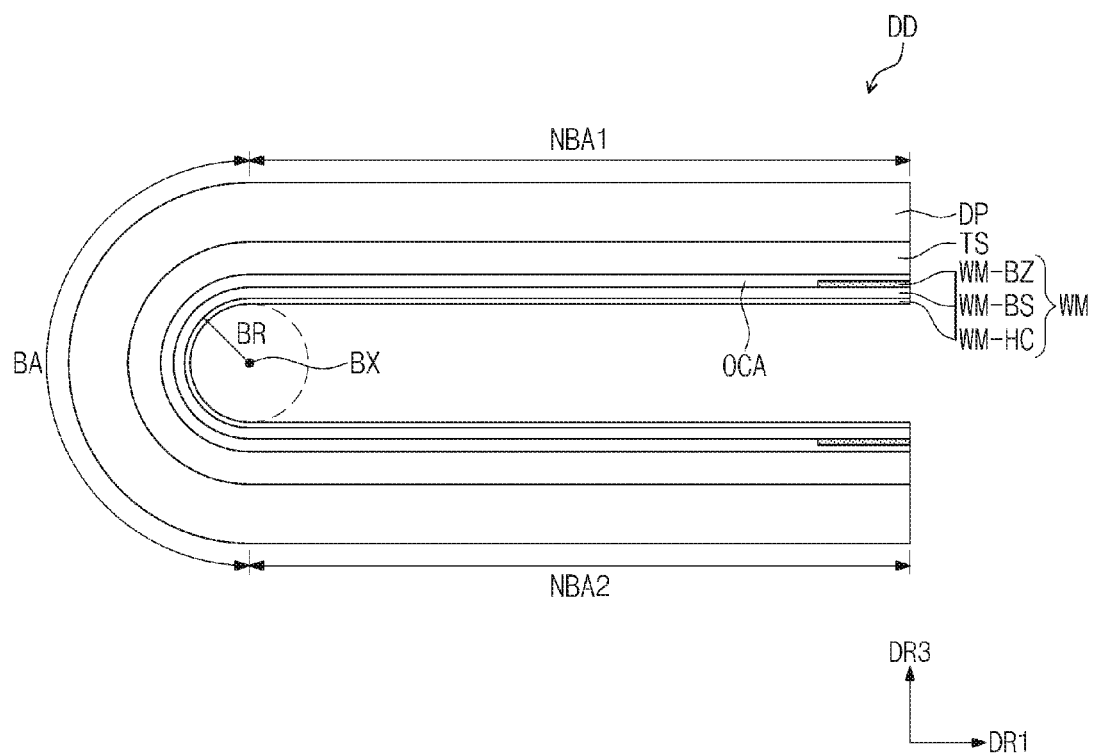
FIG. 2B is a cross-sectional view according to a second operation of a flexible display device according to an embodiment of the present disclosure.

FIG. 1A is a perspective view according to a first operation of a flexible display device DD according to an embodiment of the present disclosure. FIG. 1B is a perspective view according to a second operation of a flexible display device DD according to an embodiment of the present disclosure. FIG. 2A is a cross-sectional view according to a first operation of a flexible display device DD according to an embodiment of the present disclosure. FIG. 2B is a cross-sectional view according to a second operation of a flexible display device DD according to an embodiment of the present disclosure.

A display surface IS to display an image IM is parallel (e.g., substantially parallel) to a plane defined by a first directional axis DR1 and a second directional axis DR2. A third directional axis DR3 indicates the normal direction to the display surface IS, for example, the thickness direction of a flexible display device DD. The front and rear surfaces for each of members of the flexible display device DD may be distinguished from one another in terms of the third directional axis DR3. However, directions indicated by the first to third directional axes DR1, DR2, and DR3 are relative concepts and may be converted to other directions. Hereinafter, first to third directions are the directions respectively indicated by the first to third directional axes DR1, DR2, and DR3, and refer to the same reference numerals.

FIGS. 1A-2B illustrate a foldable display device as an embodiment of a flexible display device DD. However, an embodiment of the present disclosure is not limited thereto, and the flexible display device DD may be a curved flexible display device having a set (e.g., predetermined) curve or a rollable flexible display device which can be rolled. The flexible display device DD according to an embodiment of the present disclosure may be used in a large electronic device such as a television or a monitor, or in an intermediate (e.g., a medium size) or small electronic device such as a mobile phone, a tablet, a car navigation system, a game, or a smartwatch.

As illustrated in FIG. 1A, a display surface IS in a flexible display device DD may be divided into a plurality of areas. The flexible display device DD includes a display area DD-DA which displays an image IM and a non-display area DD-NDA which does not display the image IM. The non-display area DD-NDA is an area in which the image is not displayed. In FIG. 1A, a vase is exemplarily illustrated as the image IM, but the flexible display device DD is not limited thereto. In an embodiment, the display area DD-DA may be rectangular, but the flexible display device DD is not limited thereto. The non-display area DD-NDA may surround the display area DD-DA. However, an embodiment of the present disclosure is not limited thereto, and the shape of the display area DD-DA and the shape of the non-display area DD-NDA may be designed relative to each other.

As illustrated in FIGS. 1A-1B, the display device DD may be defined on the basis of a bending axis BX as a bending area BA which bends, and a first non-bending area NBA1 and a second a second non-bending area NB2 which do not bend (or which bend less than the bending area BA or substantially do not bend). The display device DD may be subject to inner-bending such that the display surface IS in the first non-bending area NBA1 and the display surface IS in the second non-bending area NBA2 are facing each other. The display device DD may be manipulated by a user so as to be subject to outer-bending such that the display surface IS is externally exposed.

In an embodiment of the present disclosure, the display device DD may include a plurality of the bending areas BA. Moreover, the bending area BA may be defined to correspond with the user's manipulation of the display device DD. For example, unlike FIG. 1B, the bending area BA may be defined to be parallel (e.g., substantially parallel) to the first directional axis DR1, and may also be defined to be in a diagonal direction. The surface area of the bending area BA is not fixed, and may be set or determined according to a bending radius BR (see FIG. 2B).

As illustrated in FIGS. 2A-2B, the display device DD may include a display panel DP, a touchscreen TS, and a window member WM. Each of the display panel DP, the touchscreen TS, and the window member WM may be flexible. The display device DD according to an embodiment of the present disclosure may further include a protective member that is coupled to the window member WM and protects the display panel DP and the touchscreen TS. In an embodiment of the present disclosure, the touchscreen TS may be disposed on the rear surface of the display panel DP, or may be integrated into the window member WM.

The display panel DP generates an image IM (e.g., an image as shown in FIG. 1A) corresponding to an input image data. The display panel DP may be an organic light emitting display panel, an electrophoretic display panel, or an electrowetting display panel, and the like, but the kind or type thereof is not limited. In an embodiment of the present disclosure, the organic light emitting display panel is exemplarily described. Further detailed description of the organic light emitting display panel is provided later herein.

The touchscreen TS receives coordinate data from an external input. The touchscreen TS is disposed on a base surface provided by the display panel DP. In the embodiment, the touchscreen TS may be manufactured with the display panel through a continuous (e.g., a substantially continuous) process.

The touchscreen TS may be a capacitive touchscreen. However, the touchscreen TS is not limited thereto and may be substituted with a touchscreen of a different method, such as an electromagnetic induction method, including two types (or kinds) of touch electrodes.

The window member WM may be coupled to the touchscreen TS using an optically clear adhesive OCA. The window member WM includes a base member WM-BS, a bezel layer WM-BZ, and a hard coating layer WM-HC. The hard coating layer WM-HC is disposed on the front surface of the base member WM-BS, and the bezel layer WM-BZ is disposed on the rear surface of the base member WM-BS. In an embodiment of the present disclosure, the bezel layer WM-BZ may be excluded.

The base member WM-BS may include a plastic film and the like. The base member WM-BS may have a single-layered or multi-layered structure (e.g., a structure including a plurality of layers), but the lamination structure thereof is not limited.

The bezel layer WM-BZ partially overlaps the base member WM-BS. The bezel layer WM-BZ may define a bezel area, for example, the non-display area NDA (see FIG. 1A) in the display device DD. The bezel layer WM-BZ may be a colored organic layer.

The hard coating layer WM-HC augments the low-hardness base member WM-BS to increase the hardness of the window member WM. Further detailed description of the hard coating layer WM-HC is provided herein with reference to FIGS. 8-11.

The window member WM may further include a functional coating layer disposed on the front surface of the window member WM-BS. The functional coating layer may include an anti-fingerprint layer, an antireflective layer, and/or the like.

Figure 3:
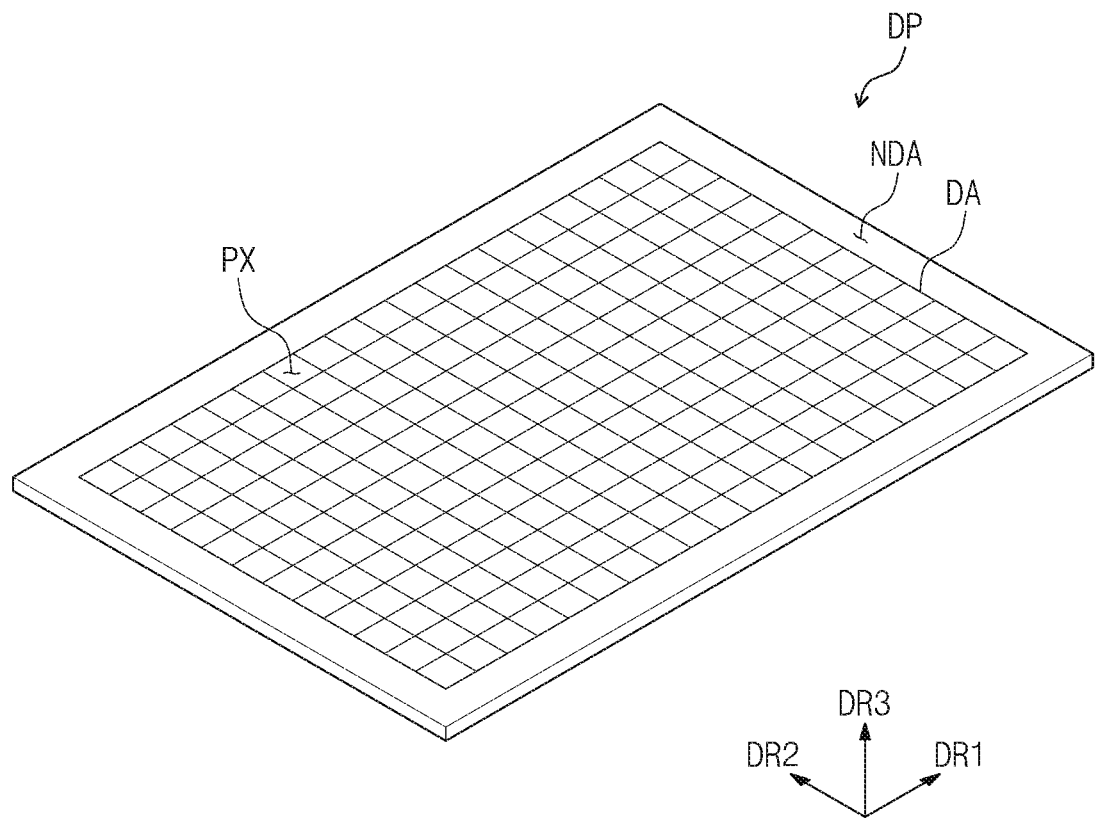
FIG. 3 is a perspective view of a flexible display panel according to an embodiment of the present disclosure.
Figure 4:
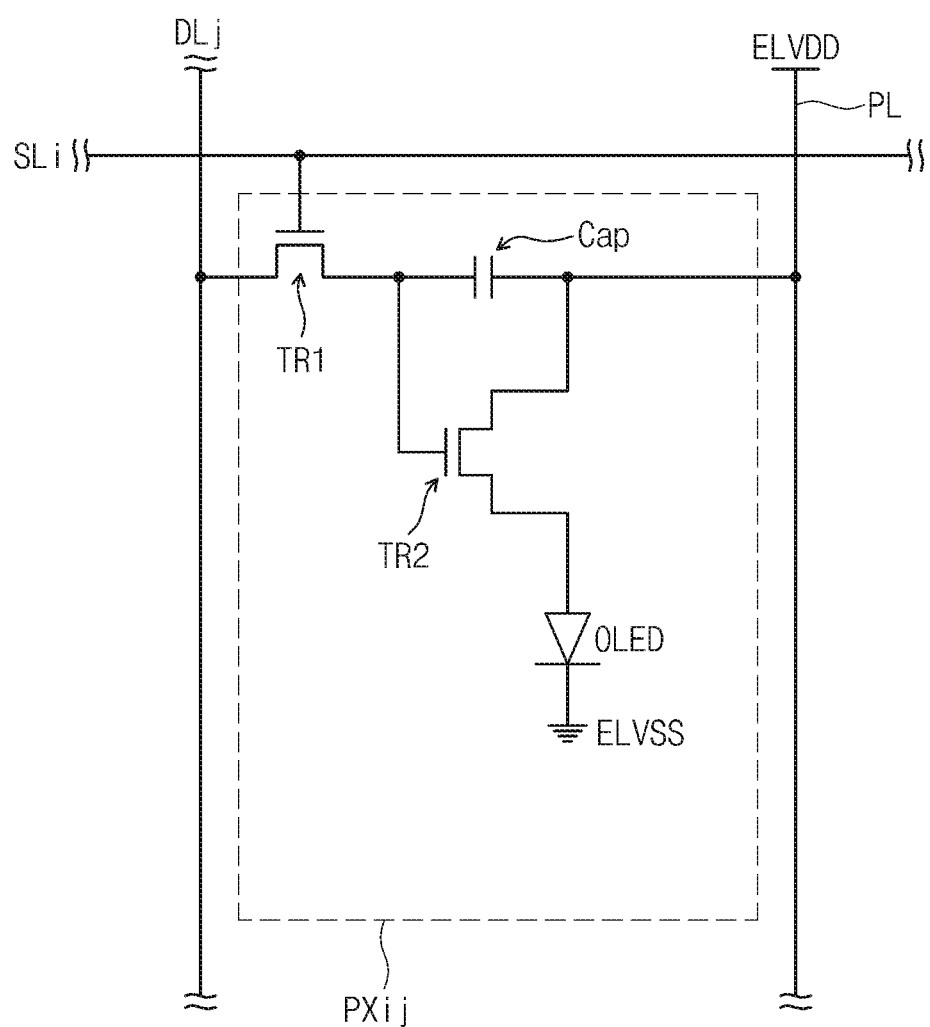
FIG. 4 is an equivalent circuit diagram of a pixel according to an embodiment of the present disclosure.

FIG. 3 is a perspective view of a flexible display panel DP according to an embodiment of the present disclosure. FIG. 4 is an equivalent circuit diagram of a pixel PX according to an embodiment of the present disclosure. Hereinafter, a flexible display panel DP is described as an organic light emitting display panel DP. When viewed along a plane, the organic light emitting display panel DP includes a display area DA and a non-display area NDA. The display area DA and the non-display area NDA in the organic light emitting display panel DP are not necessarily the same as the display area DD-DA and the non-display area DD-NDA defined in the display device DD by the bezel layer WM-BZ, and may change or may be modified according to the structure/design of the organic light emitting display panel DP.

As illustrated in FIG. 3, the organic light emitting display panel DP includes a plurality of pixels PX in the display area DA. The plurality of pixels PX is illustrated as a matrix, but the plurality of pixels PX is not limited thereto. The plurality of pixels PX may be in a non-matrix form. For example, the plurality of pixels PX may be arranged in a PenTile form.

In FIG. 4, the equivalent circuit diagram for a single pixel PXij coupled to (or connected to) an ith scan line SLi and a jth source line DLj is exemplarily illustrated. Each of the plurality of pixels PX may have the same (e.g., substantially the same) equivalent circuit.

The pixel PXij includes at least one transistor TR1 and TR2, at least one capacitor Cap, and an organic light emitting diode OLED. In the embodiment of FIG. 4, a pixel driver circuit having two transistors TR1 and TR2 and one capacitor Cap is exemplarily illustrated, but configurations of the pixel driver circuit are not limited thereto.

An anode in the organic light emitting diode OLED receives a first power voltage ELVDD applied to a power line PL through a second transistor TR2. A cathode in the organic light emitting diode OLED receives a second power voltage ELVSS. A first transistor TR1 responds to a scanning signal applied to an ith scan line SLi and outputs a data signal which is applied to a jth source line DLj. The capacitor Cap charges a voltage corresponding to a data signal received from the first transistor TR1. The second transistor TR2 controls a driving current which corresponds to the voltage stored in the capacitor Cap and flows to the organic light emitting diode OLED.

Figure 5:
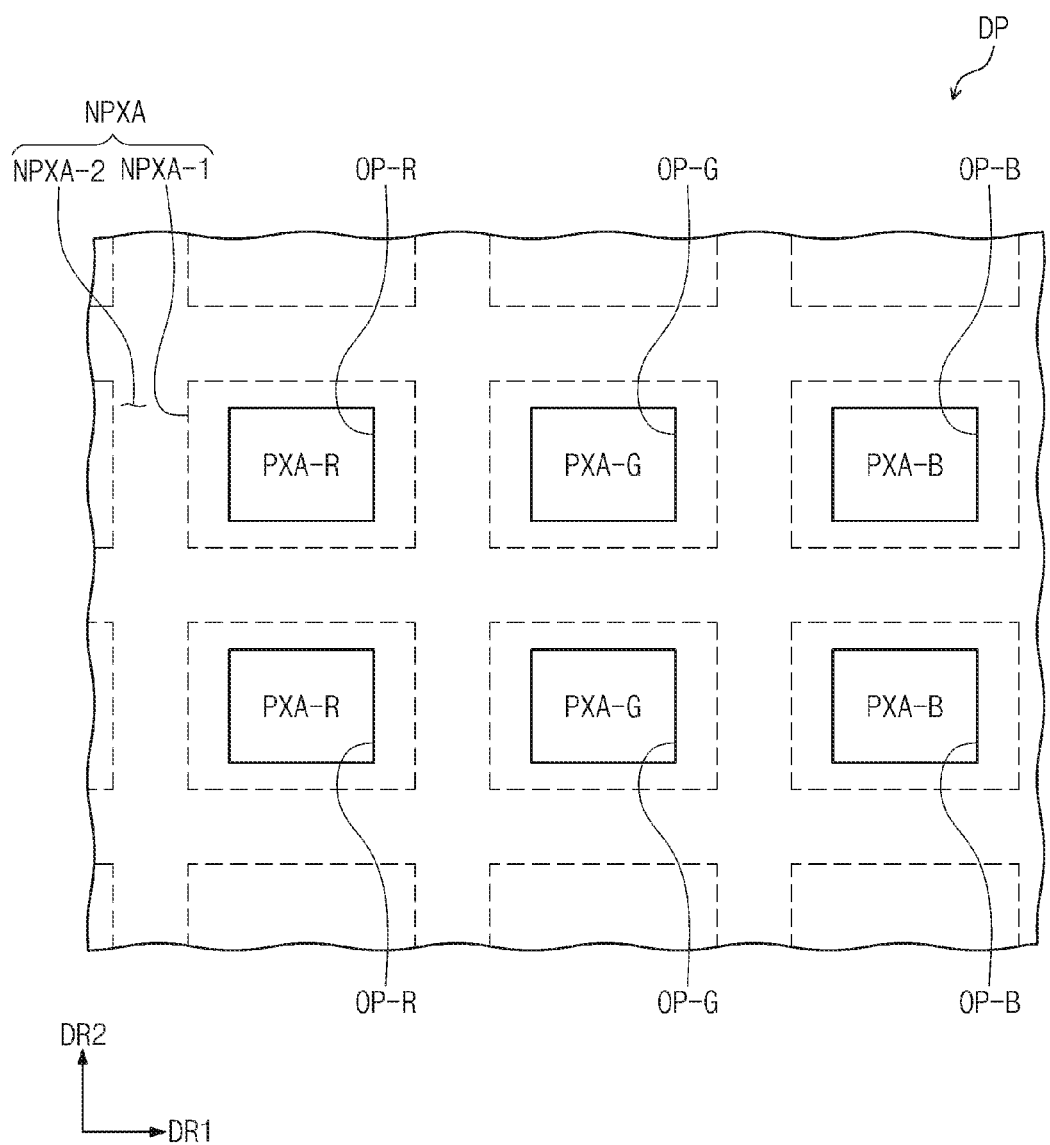
FIG. 5 is a partial plan view of an organic light emitting display panel according to an embodiment of the present disclosure.
Figure 6A:
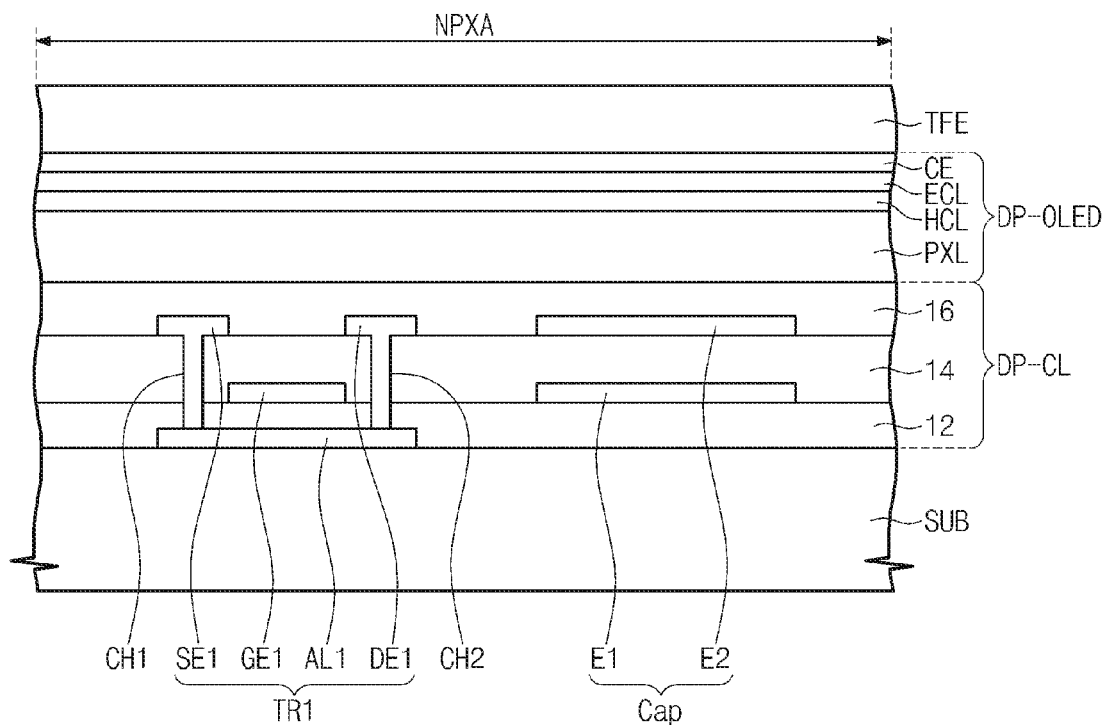
FIGS. 6A-6B are partial cross-sectional views of an organic light emitting display panel according to an embodiment of the present disclosure.
Figure 6B:
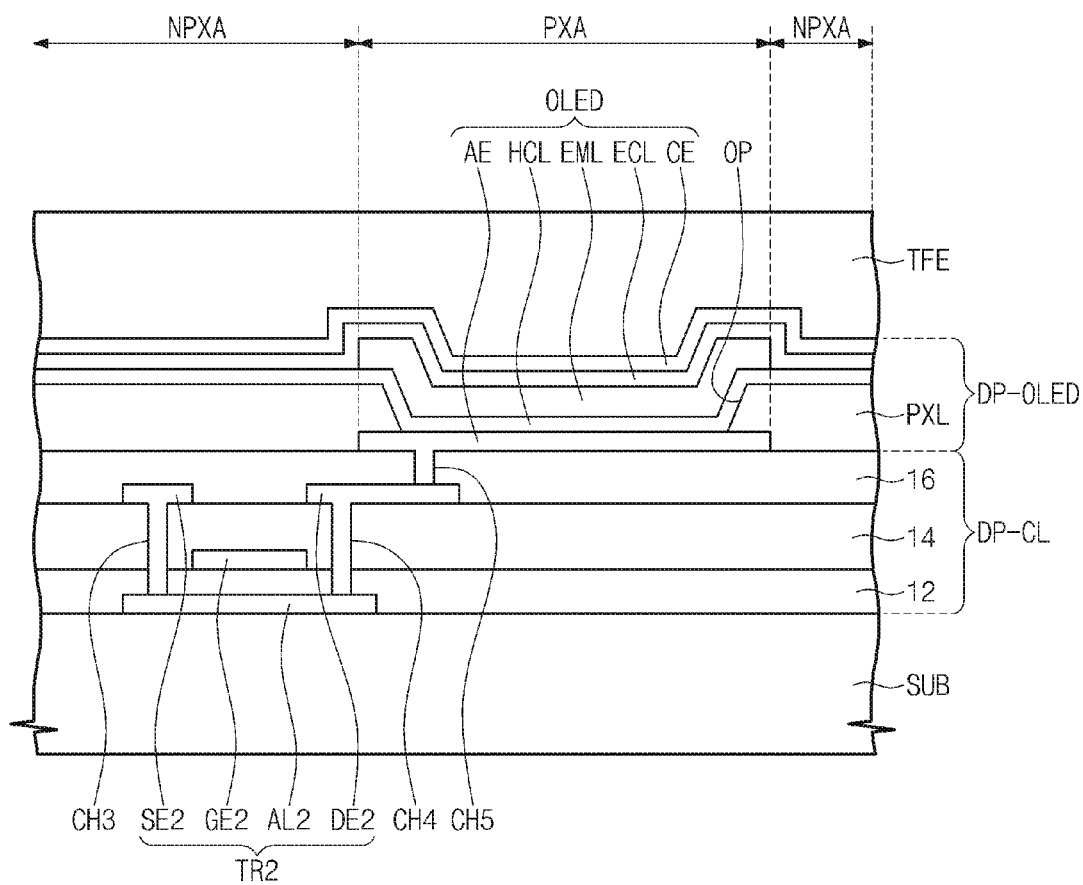

FIG. 5 is a partial plan view of an organic light emitting display panel DP according to an embodiment of the present disclosure. FIGS. 6A-6B are partial cross-sectional views of an organic light emitting display panel DP according to an embodiment of the present disclosure. FIG. 5 illustrates a portion of a display area DA (see FIG. 3). FIG. 6A illustrates a cross section of a portion corresponding to the first transistor TR1 and the capacitor Cap in the equivalent circuit illustrated in FIG. 4, and FIG. 6B illustrates a cross section of a portion corresponding to the second transistor TR2 and the organic light emitting diode OLED in the equivalent circuit illustrated in FIG. 4.

As illustrated in FIG. 5, an organic light emitting display panel DP is defined by a plurality of light emitting areas PXA-R, PXA-G, and PXA-B and a non-light emitting area NPXA, which are disposed on a plane defined by a first directional axis DR1 and a second directional axis DR2. FIG. 5 exemplarily illustrates three types (or kinds) of the light emitting areas PXA-R, PXA-G, and PXA-B which are arranged in a matrix. Organic light emitting diodes emitting three different types (or kinds) of colors may be respectively disposed in the three types (or kinds) of light emitting areas PXA-R, PXA-G, and PXA-B.

In an embodiment of the present disclosure, organic light emitting diodes that emit white-colored light may be respectively disposed in the three types (or kinds) of light emitting areas PXA-R, PXA-G, and PXA-B. Here, three types (or kinds) of differently colored color filters may respectively overlap the three types (or kinds) of light emitting areas PXA-R, PXA-G, and PXA-B.

The non-light emitting area NPXA may be divided into first non-light emitting areas NPXA-1 and a second non-light emitting area NPXA-2, which defines the boundaries of the first light emitting areas NPXA-1. A corresponding driver circuit, for example, transistors TR1 and TR2 (see FIG. 4) or a capacitor Cap (see FIG. 4), may be disposed in each of the first non-light emitting areas NPXA-1. Signal lines, for example, a scan line SLi (see FIG. 4), a source line DLj (see FIG. 4), and/or a power line PL (see FIG. 4), may be disposed in the second non-light emitting area. However, an embodiment of the present disclosure is not limited thereto, and the first non-light emitting areas NPXA-1 and the second non-light emitting area NPXA-2 may be indistinguishable from each other.

According to an embodiment of the present disclosure, each of the light emitting areas PXA-R, PXA-G, and PXA-B may have a shape which is similar to that of a rhombus (e.g., substantially a rhombus). According to an embodiment of the present disclosure, four light emitting diodes that emit differently colored lights from each other (e.g., four light emitting diodes that may respectively emit light having a color different from that of the light emitted by the other of the four light emitting diodes) may be respectively disposed in four types (or kinds) of repeatedly arranged light emitting regions.

In the present disclosure, the statement "that emit light of a set (e.g., predetermined) color in a light emitting area" not only includes emitting light generated in a corresponding light emitting diode, but also includes modifying the color of light which is generated in a corresponding light emitting diode and then emitting the light.

As illustrated in FIGS. 6A-6B, an organic light emitting display panel DP includes a base substrate SUB, a circuit layer DP-CL, an organic light emitting diode layer DP-OLED, and a thin film encapsulation layer TFE. The circuit layer DP-CL may include a plurality of conductive layers and a plurality of insulating layers, and the organic light emitting layer DP-OLED may include a plurality of conductive layers and a plurality of functional organic layers. The thin film encapsulation layer TFE may include a plurality of organic layers and/or a plurality of inorganic layers.

The base substrate SUB is a flexible substrate and may include a plastic substrate such as, for example, polyimide, a glass substrate, a metal substrate, or the like. On the base substrate SUB are disposed a semiconductor pattern AL1 (hereinafter, referred to as a first semiconductor pattern) of a first transistor TR1 and a semiconductor pattern AL2 (hereinafter, referred to as a second semiconductor pattern) of a second transistor TR2. The first semiconductor pattern AL1 and the second semiconductor pattern AL2 may include an amorphous silicon formed at a low temperature. Other first and second semiconductor patterns AL1 and AL2 may include metal oxide semiconductors. Functional layers may be further disposed on a surface of the base substrate SUB. The functional layers include at least one of a barrier layer or a buffer layer. The first semiconductor pattern AU and the second semiconductor pattern AL2 may be disposed on the barrier layer or the buffer layer.

A first insulating layer 12 covering the first semiconductor pattern AL1 and the second semiconductor pattern AL2 is disposed on the base substrate SUB. The first insulating layer 12 includes an organic layer and/or an inorganic layer. For example, the first insulating layer 12 may include a plurality of inorganic thin films. The plurality of inorganic thin films may include, for example, a silicon nitride layer and a silicon oxide layer.

A gate electrode GE1 (hereinafter, referred to as first gate electrode) of the first transistor TR1 and a gate electrode GE2 (hereinafter, referred to as second gate electrode) of the second transistor TR2 are disposed on the first insulating layer 12. A first electrode E1 of a capacitor Cap is disposed on the first insulating layer 12. The first gate electrode GE1, the second gate electrode GE2, and the first electrode E1 may be manufactured according to the same (e.g., substantially the same) photolithography process as a scan line SLi (see FIG. 4). For example, the first electrode E1 may be formed of the same (e.g., substantially the same) material as the scan line.

A second insulating layer 14 covering the first gate electrode GE1, the second gate electrode GE2, and the first electrode E1 is disposed on the first insulating layer 12. The second insulating layer 14 includes an organic layer and/or an inorganic layer. For example, the second insulating layer 14 may include a plurality of inorganic thin films. The plurality of inorganic thin films may include, for example, a silicon nitride layer and a silicon oxide layer.

A source line DLj (see FIG. 4) and a power line PL (see FIG. 4) may be disposed on the second insulating layer 14. A source electrode SE1 (hereinafter, referred to as first source electrode) and a drain electrode DE1 (hereinafter, referred to as first drain electrode) of the first transistor TR1 are disposed on the second insulating layer 14. A source electrode SE2 (hereinafter, referred to as second source electrode) and a drain electrode DE2 (hereinafter, referred to as second drain electrode) of the second transistor TR2 are disposed on the second insulating layer 14. The first source electrode SE1 is branched from the source line DLj. The second source electrode SE2 is branched from the power line PL.

A second electrode E2 of the capacitor Cap is disposed on the second insulating layer 14. The second electrode E2 may be manufactured according to the same (e.g., substantially the same) photolithography process and be made from the same (e.g., substantially the same) material as the source line DLj and the power line PL.

The first source electrode SE1 and the first drain electrode DE1 are respectively coupled to (or connected to) the first semiconductor pattern AL1 through a first through-hole CH1 and a second through-hole CH2 which pass through the first insulating layer 12 and the second insulating layer 14. The first drain electrode DE1 may be electrically coupled to (or electrically connected to) the first electrode E1. For example, the first drain electrode DE1 may be coupled to (or connected to) the first electrode E1 through a through-hole which passes through the second insulating layer 14. The second source electrode SE2 and the second drain electrode DE2 are respectively coupled to (or connected to) the second semiconductor pattern AL2 through a third through-hole CH3 and a fourth through-hole CH4 which pass through the first insulating layer 12 and the second insulating layer 14. Meanwhile, in another embodiment of the present disclosure, the first transistor TR1 and the second transistor TR2 may be modified to have bottom gate structures.

A third insulating layer 16 covering the first source electrode SE1, the first drain electrode DE1, the second source electrode SE2, and the second drain electrode DE2 is disposed on the second insulating layer 14. The third insulating layer 16 includes an organic layer and/or an inorganic layer. For example, the third insulating layer 16 may include an organic material in order to provide a flat surface.

A pixel defining film PXL and an organic light emitting diode OLED are disposed on the insulating layer 16. An opening OP is defined in the pixel defining film PXL. The pixel defining film PXL may function as another insulating layer. The opening OP in FIG. 6B may correspond to the openings OP-R, OP-G, and OP-B in FIG. 5.

An anode AE is coupled to (or connected to) the second drain electrode DE2 through a fifth through-hole CH5 which passes through the third insulating layer 16. The opening OP in the pixel defining film PXL exposes at least a portion of the anode AE. A hole control layer HCL may be commonly formed in (e.g., may be formed in both) the light emitting areas PXA-R, PXA-G, and PXA-B (see FIG. 5) and the non-light emitting layer NPXA (see FIG. 5). An organic light emitting layer EML and an electron control layer ECL are successively formed on the hole control layer HCL. The hole control layer HCL includes at least a hole transport layer, and the electron control layer ECL includes at least an electron transport layer. Afterwards, a cathode CE may be commonly formed in (e.g., may be formed in both) the light emitting areas PXA-R, PXA-G, and PXA-B and the non-light emitting area NPXA. The cathode CE may be formed through a deposition or sputtering method according to the layered structure of the cathode CE.

A light emitting area PXA may be defined as the area in which light is generated. The light emitting area PXA may be defined so as to correspond to the anode AE or light emitting layer EML in the organic light emitting diode OLED.

The thin film encapsulation layer TFE which encapsulates the organic light emitting diode layer DP-OLED is disposed on the cathode CE. The thin film encapsulation layer TFE protects the organic light emitting diode OLED from moisture and foreign substances.

The thin film encapsulation layer TFE includes at least two inorganic thin films and an organic thin film disposed therebetween. The inorganic thin films protect the organic light emitting diode OLED from moisture, and the organic thin film protects the organic light emitting diode OLED from foreign substances such as dust particles. The thin film encapsulation layer TFE may include a plurality of inorganic thin films and a plurality of organic thin films which are alternately disposed.

Figure 7A:
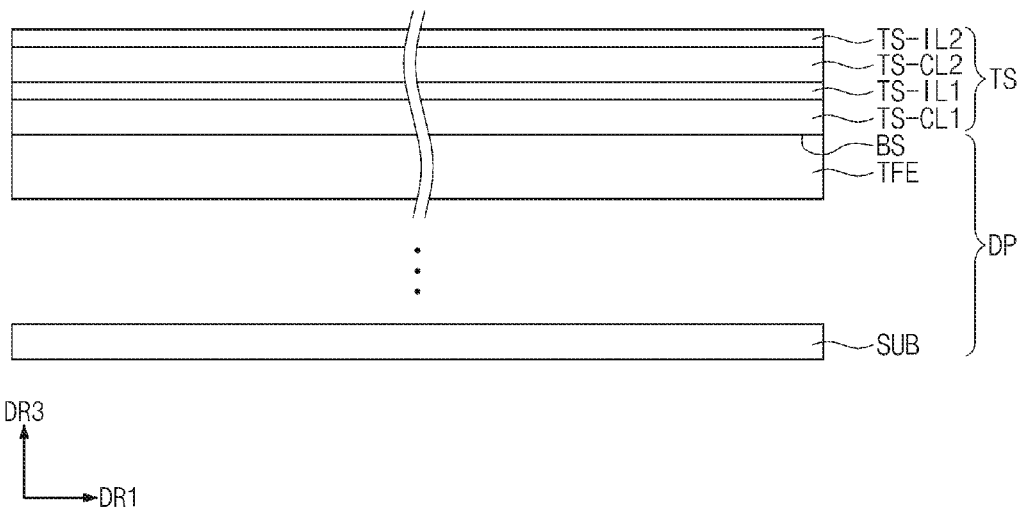
FIGS. 7A-7B are cross-sectional views of a display device according to an embodiment of the present disclosure.
Figure 7B:
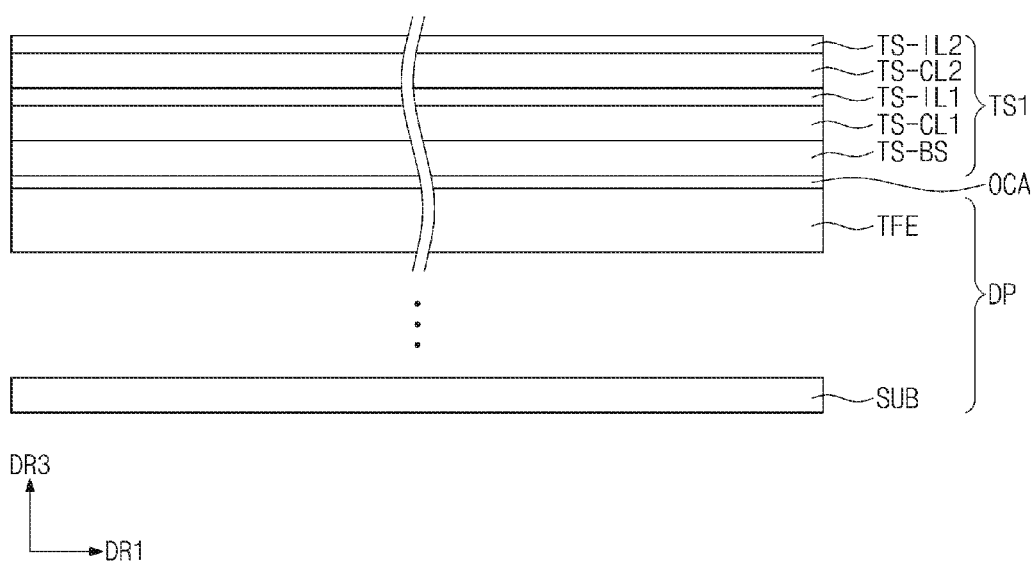

FIGS. 7A-7B are cross-sectional views of display devices according to an embodiment of the present disclosure. A display panel DP is schematically illustrated. Similarities and differences between display devices are described with reference to FIGS. 7A-7B.

As illustrated in FIG. 7A, a touchscreen TS includes a first conductive layer TS-CL1, a first insulating layer TS-IL1, a second conductive layer TS-CL2, and a second insulating layer TS-IL2. The touchscreen TS may be disposed directly on a display panel DP. Each of the first conductive layer TS-CL1 and the second conductive layer TS-CL2 may have a single-layered structure or a multi-layered structure that is laminated along a third directional axis DR3. The multi-layered conductive layer may include a transparent conductive layer and at least one metal layer. The transparent conductive layer may include, for example, indium tin oxide (ITO), indium zinc oxide (IZO), zinc oxide (ZnO), indium tin zinc oxide (ITZO), PEDOT, a metal nanowire, and/or graphene. The metal layer may include molybdenum, silver, titanium, copper, aluminum, and/or alloys thereof.

Each of the first conductive layer TS-CL1 and the second conductive layer TS-CL2 may include a plurality of patterns. The first conductive layer TS-CL1 may be disposed on a thin film encapsulation layer TFE. For example, the thin film encapsulation layer TFE may provide a base surface BS on which the touchscreen TS is disposed. Each of the first insulating layer TS-IL1 and the second insulating layer TS-IL2 may include one of an inorganic layer or an organic layer.

As illustrated in FIG. 7B, a touchscreen TS1 may be coupled to a display panel DP using an optically clear adhesive OCA. The touchscreen TS1 may further include a base member TS-BS in which a first conductive layer TS-CL1 is disposed.

Figure 8:
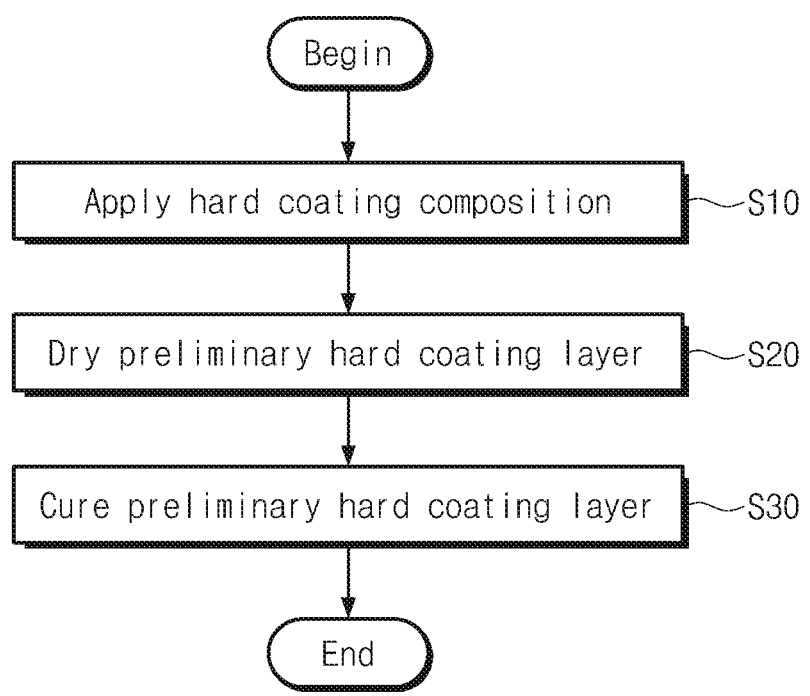
FIG. 8 is a flow chart illustrating a method for manufacturing a window member WM according to an embodiment of the present disclosure.
Figure 9A:
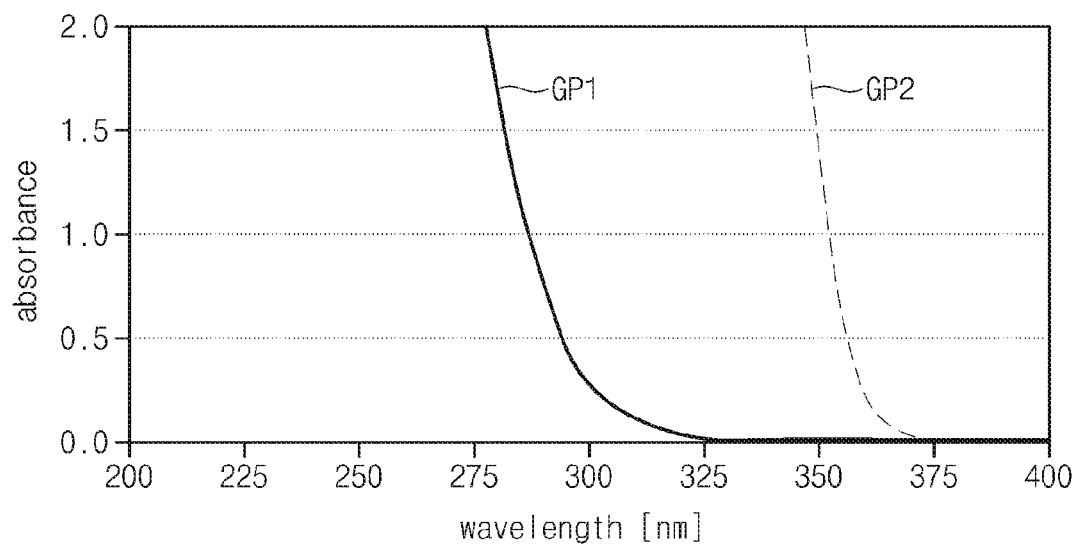
FIGS. 9A-9B illustrate absorbance wavelengths according to types (or kinds) of photoinitiators.
Figure 9B:
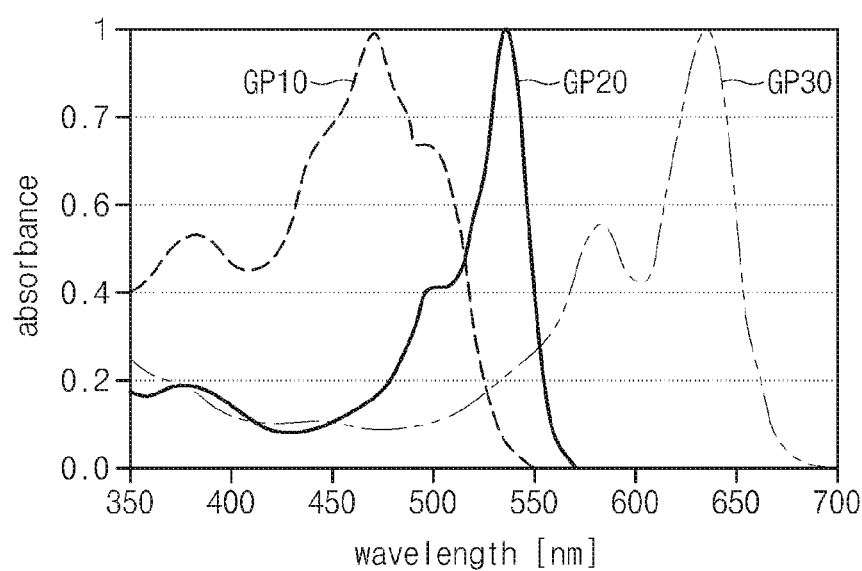
Figure 10:
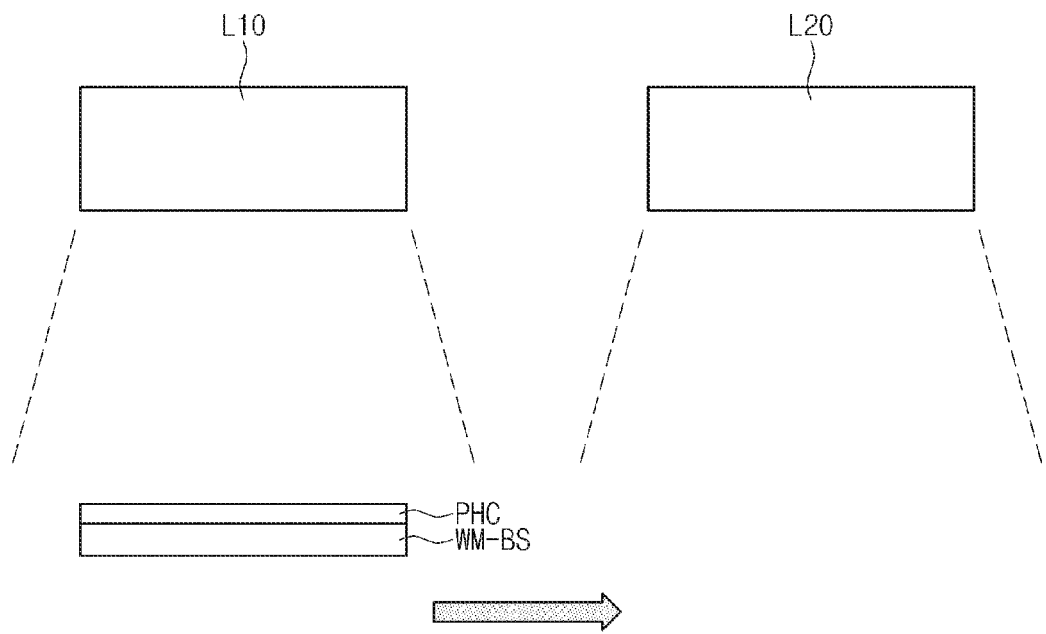
FIG. 10 illustrates a process for photo-curing a hard coating layer according to an embodiment of the present disclosure.

FIG. 8 is a flow chart illustrating a method for manufacturing a window member WM according to an embodiment of the present disclosure. FIGS. 9A-9B illustrate absorbance wavelengths according to types (or kinds) of photoinitiators. FIG. 10 illustrates a process for photo-curing a hard coating layer according to an embodiment of the present disclosure.

Referring to FIG. 8, first, a prepared hard coating composition is applied onto a surface of a base member WM-BS S10. The hard coating composition may be applied using a method such as, for example, roll-to-roll coating, spin coating, slit coating, bar coating, or ink printing. The hard coating composition applied onto a surface of the base member WM-BS may form a preliminary hard coating layer. The hard coating composition includes a solvent, hard coating oligomers, cross-linking oligomers, and a photoinitiator. The hard coating composition may further include other additives.

The solvent may include a ketone-based solvent or an ether-based solvent. The ketone-based solvent may include methyl ethyl ketone, acetophenone, cyclopentanone, ethyl isopropyl ketone, 2-hexanone, isophorone, mesityl oxide, methyl isobutyl ketone, 3-methyl-2-pentanone, 2-pentanone, 3-pentanone, and/or the like. The ether-based solvent may include cyclopentyl methyl ether (CPME), diethylene glycol diethyl ether, dimethoxymethane, methyl tert-butyl ether, 2-(2-methoxyethoxy)ethanol, propylene glycol ether, and/or the like.

Each of the hard coating oligomers is represented by the following Formula 1.

[Formula 1]

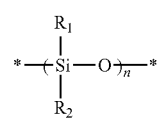

In Formula 1, n is selected from 8 to 150, $R_1$ is one of a hydroxy group, a substituted or unsubstituted aryl group having from 6 to 30 carbon atoms for forming a ring, an alkoxy group, a substituted or unsubstituted alkyl group having from 1 to 20 carbon atoms, or a photoinitiated reactive group. In the formula, "————*" indicates parts which couple to (or connect to) a different repeating unit. At least one of the plurality of $R_1$s included in a single oligomer is a photoinitiated reactive group. $R_2$ may be one of a hydroxy group, a substituted or unsubstituted aryl group having from 6 to 30 carbon atoms for forming a ring, an alkoxy group, a substituted or unsubstituted alkyl group having from 1 to 20 carbon atoms, or a photoinitiated reactive group.

According to an embodiment of the present disclosure, in order to increase the hardness of the hard coating layer, n may be selected from 8 to 24 in Formula 1. The molecular weight of the oligomer according to Formula 1 may be 2000 to 5000. According to an embodiment of the present disclosure, in order to increase the flexibility of the hard coating layer while maintaining the hardness, n may be selected from 25 to 40 in Formula 1. The molecular weight of the oligomer according to Formula 1 may be 5000 to 8000. According to an embodiment of the present disclosure, in order to increase the flexibility of the hard coating layer, n may be selected from 48 to 150 in Formula 1. The molecular weight of the oligomer according to Formula 1 may be 10000 to 30000.

In the present disclosure, a "photoinitiated reactive group" may indicate a reactive group including a part which reacts when light is emitted thereon. For example, a below-described photoinitiator may form a radical or a cation due to light, and a photoinitiated reactive group may indicate a reactive group that includes a part which reacts due to the radical or the cation. The photoinitiated reactive group may include, for example, an ester group substituted with a substituent including an epoxy group or an alkenyl group, an alkyl group having from 1 to 20 carbon atoms and substituted with a substituent including an epoxy group or an alkenyl group, or a substituted or unsubstituted alkenyl group having from 1 to 20 carbon atoms, but the photoinitiated reactive group is not limited thereto.

The photoinitiated reactive group may be one of Formula 2 or Formula 3.

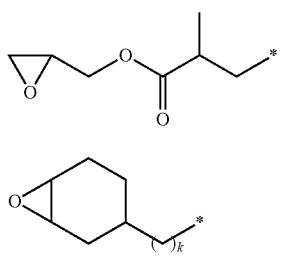
[Formula 2]

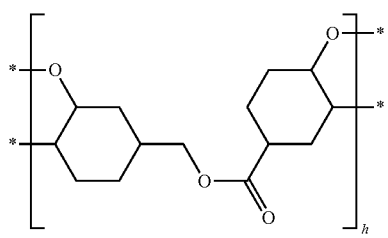
[Formula 3]

In Formula 3, k is selected from 1 to 10.

Each of the cross-linking oligomers may be represented by Formula 4.

[Formula 4]

In Formula 4, h is selected from 2 to 20.

The photoinitiator may include at least one of a free radical type (or kind) of initiator or a cationic type (or kind) of initiator. The photoinitiator may include at least two types (or kinds) of photoinitiators which are initiated (e.g., activated) by light of different wavelengths (e.g., the first photoinitiator may be initiated by light having a wavelength different from that of light that initiates the second photoinitiator). For example, the photoinitiator may include a short wavelength initiator and a long wavelength initiator.

As illustrated in FIG. 9A, the photoinitiator may include a first photoinitiator and a second photoinitiator which are activated by ultraviolet radiation of different wavelength ranges from each other. The first photoinitiator may have the wavelength-absorbance of the first graph GP1, and the second photoinitiator may have the wavelength-absorbance of the second graph GP2.

As illustrated in FIG. 9B, the photoinitiator may include a first photoinitiator, a second photoinitiator, and a third photoinitiator which are activated by visible light of different wavelength ranges from each other. The first photoinitiator may have the wavelength-absorbance of the first graph GP10, the second photoinitiator may have the wavelength-absorbance of the second graph GP20, and the third photoinitiator may have the wavelength-absorbance of the third graph GP30.

In an embodiment of the present disclosure, the hard coating composition may further include a first additive in order to improve the flexibility of the hard coating layer which is to be prepared. The first additive may include a bisphenol-A-epoxy-silicone block copolymer. The bisphenol-A-epoxy-silicone block copolymer has a linear structure, and a function of bonding with the first oligomers, the second oligomers, the cross-linkers, or bonding therebetween to elongate or extend the molecular structure of the hard coating polymer. Therefore, the flexibility of the hard coating layer may be further improved.

In an embodiment of the present disclosure, the hard coating composition may further include a second additive in order to improve the hardness of the hard coating layer which is to be prepared. The second additive may include silicon nanoparticles. The silicon nanoparticles may be interspersed between the formed hard coating polymers to further improve the hardness of the hard coating layer.

Next, the preliminary hard coating layer is dried S20. The solvent in the preliminary hard coating layer is removed. The dried preliminary hard coating layer may be a mixture layer having a set (e.g., predetermined) viscosity. In an embodiment of the present disclosure, the dried preliminary hard coating layer may not only include the cross-linking oligomers, the hard coating oligomers, and the photoinitiator, but may further include at least one of the first additive or the second additive.

Afterwards, the dried preliminary hard coating layer is photo-cured S30. A photoreaction is initiated (e.g., activated) by a photoinitiator when light is emitted thereon. Photoinitiated reactive groups in each of the hard coating oligomers and the cross-linking oligomers are activated (e.g., initiated) by the photoinitiator. The photoinitiated reactive groups in the cross-linking oligomers bond with the photoinitiated reactive groups in the hard coating oligomers. For example, the cross-linking oligomers may couple (or connect) the hard coating hard coating oligomers. The hard coating layer WM-HC illustrated in FIGS. 2A-2B is formed as the hard coating polymer is synthesized.

The hard coating layer may be aged in order to stabilize the photo-cured hard coating layer. The hard coating layer may be subjected to a primary aging at room temperature and a secondary aging at high temperature/high humidity (for example, a temperature/high humidity of 60 degrees/93%).

When the hard coating composition includes a plurality of types (or kinds) of photoinitiators which are activated by ultraviolet radiation of different wavelength ranges from each other, light of different wavelength ranges may be successively emitted using a plurality of light sources L10 and L20, as illustrated in FIG. 10. In FIG. 10, two of the light sources L10 and L20 are exemplarily illustrated.

When light of a first wavelength range is emitted onto the preliminary hard coating layer PHC from the first light source L10, the hard coating oligomers and the cross-linking oligomers are partially chemically bonded by any one type (or kind) of photoinitiator among the plurality of types (or kinds) of photoinitiators. Later, when light of a second wavelength range is emitted onto the preliminary hard coating layer PHC from the second light source L20, the hard coating oligomers and the cross-linking oligomers are chemically bonded by another type (or kind) of photoinitiator among the plurality of types (or kinds) of photoinitiators.

By photo-curing the hard coating layer using the plurality of types (or kinds) of photoinitiators and the corresponding plurality of light sources, the hard coating polymer may be uniformly (e.g., substantially uniformly) synthesized. Since the depth to which light reaches differs according to the wavelength of the light, the light may be uniformly (e.g., substantially uniformly) provided regardless of the thickness of the hard coating layer PHC.

Figure 11:
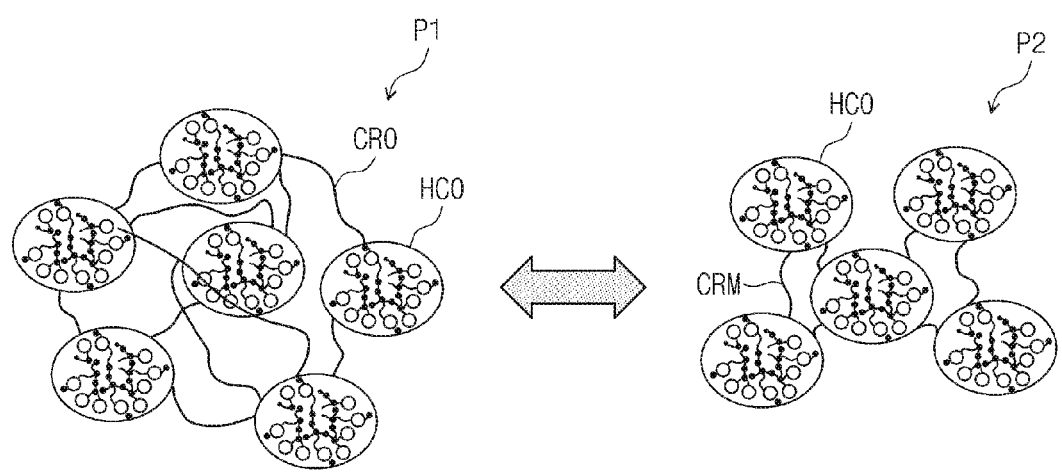
FIG. 11 illustrates a hard coating polymer according to an embodiment of the present disclosure and a hard coating polymer according to a comparative example.

FIG. 11 illustrates a hard coating polymer according to an embodiment of the present disclosure and a hard coating polymer according to a comparative example.

A first polymer P1 illustrated in FIG. 11 corresponds to a portion of a hard coating layer prepared according to an embodiment of the present disclosure. The first polymer P1 includes hard coating oligomers HCO and cross-linking oligomers CRO which couple (or connect) the hard coating oligomers HCO. The first polymer P1 was synthesized according to methods described with reference to FIGS. 8-10.

The hard coating layer according to an embodiment of the present disclosure includes a polymer such as Formula 5.

  [Formula 5]

In Formula 5, each of X and Y may be the hard coating oligomer such as Formula 1 (or Formula 10), and Z may be the cross-linking oligomer such as Formula 4. The hard coating layer may have a thickness of from 10 to 100 μm. The hard coating layer has a molecular weight of 50000 to 100000 per unit surface area (1 mm²).

[Formula 10]

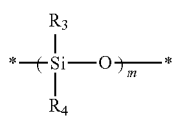

In Formula 10, m is selected from 8 to 150, $R_3$ is one of a hydroxy group, a substituted or unsubstituted aryl group having from 6 to 30 carbon atoms for forming a ring, an alkoxy group, a substituted or unsubstituted alkyl group having from 1 to 20 carbon atoms, or a photoinitiated reactive group. In the formula, "———————*" indicates parts which couple to (or connect to) a different repeating unit. At least one of the plurality of $R_3$s included in a single oligomer is a photoinitiated reactive group. $R_4$ may be one of a hydroxy group, a substituted or unsubstituted aryl group having from 6 to 30 carbon atoms for forming a ring, an alkoxy group, a substituted or unsubstituted alkyl group having from 1 to 20 carbon atoms, or a photoinitiated reactive group.

According to an embodiment of the present disclosure, in order to increase the hardness of the hard coating layer, m may be selected from 8 to 24 in Formula 10. The molecular weight of the oligomer according to Formula 10 may be 2000 to 5000. According to an embodiment of the present disclosure, in order to increase the flexibility of the hard coating layer while maintaining the hardness, m may be selected from 25 to 40 in Formula 10. The molecular weight of the oligomer according to Formula 10 may be 5000 to 8000. According to an embodiment of the present disclosure, in order to increase the flexibility of the hard coating layer, m may be selected from 48 to 150 in Formula 10. The molecular weight of the oligomer according to Formula 10 may be 10000 to 30000.

A second polymer P2 illustrated in FIG. 11 corresponds to a portion of a hard coating layer according to a comparative example. The second polymer P2 includes hard coating oligomers HCO and cross-linking oligomers CRO which couple (or connect) the hard coating oligomers HCO. For example, the second polymer P2 has a form such as Formula 5, in which Z may be a cross-linking monomer.

The hard coating layer according to the present embodiment has an improved flexibility when compared to the hard coating layer according to the comparative example. As illustrated in FIGS. 2A-2B, even when a flexible display device is bent, the hard coating layer WM-HC is not easily damaged. Further detailed description is given with reference to Table 1.

TABLE 1

|  | Comparative Example | Example 1 | Example 2 | Example 3 | Example 4 |
|---|---|---|---|---|---|
| h in Formula 4 | 1 | 2-3 | 4-5 | 8-10 | 12 |
| Surface hardness/indentation hardness | 9H/2H | 9H/2H | 9H/2H | 8H/H | 7H/H |
| Bending stiffness (N)-radius of curvature 3 mm | 8.7 | 7.0 | 6.2 | 5.8 | 5.3 |
| Bending stiffness (N)-radius of curvature 5 mm | 7.4 | 6.0 | 5.0 | 4.7 | 4.1 |
| Maximum possible radiation of curvature (mm) | 2.5 | 2.5 | 1.5 | 1.0 | 0.5 |

The values for Examples 1 to 4 were measured from hard coating layers formed from a hard coating composition including hard coating oligomers (e.g., cross-linking oligomers) synthesized using the monomer of Formula 6 and hard coating oligomers synthesized using the monomer of Formula 7.

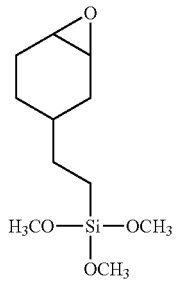

[Formula 6]

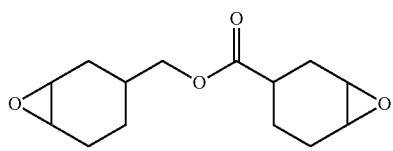

[Formula 7]

Each of the hard coating layers of the comparative example and Examples 1 to 4 was formed from a hard coating oligomer having a molecular weight of 10000 (n in Formula 1 being selected from 48 to 50).

The hard coating layer according to the comparative example was formed using the cross-linking monomers according to Formula 7, and Examples 1 to 4 were formed using the cross-linking oligomers synthesized from Formula 7. The hard coating layers of Examples 1 to 4 were formed using the cross-linking oligomers having different molecular weights.

The hard coating compositions of the comparative example contain 80 wt % of the hard coating oligomers, 15 wt % of the cross-linking monomers, and 5 wt % of cationic type (or kind) of initiators with respect to 100 wt % of the respective solid contents. The hard coating compositions of the Examples 1 to 4 contain 80 wt % of the hard coating oligomers, 15 wt % of the cross-linking oligomers, and 5 wt % of cationic type (or kind) of initiators with respect to 100 wt % of the respective solid contents. Other conditions for preparing the hard coating layers are identical.

As measured in Table 1, it was observed that the longer the length of the cross-linking oligomers, the greater the improvement in the flexibility. Increasing the length of the cross-linking oligomers decreased the bending stiffness and decreased the maximum radius of curvature. The surface hardness and the indentation hardness were indicated using pencil hardness and observed to be maintained at a hardness of H or higher.

Figure 12A:
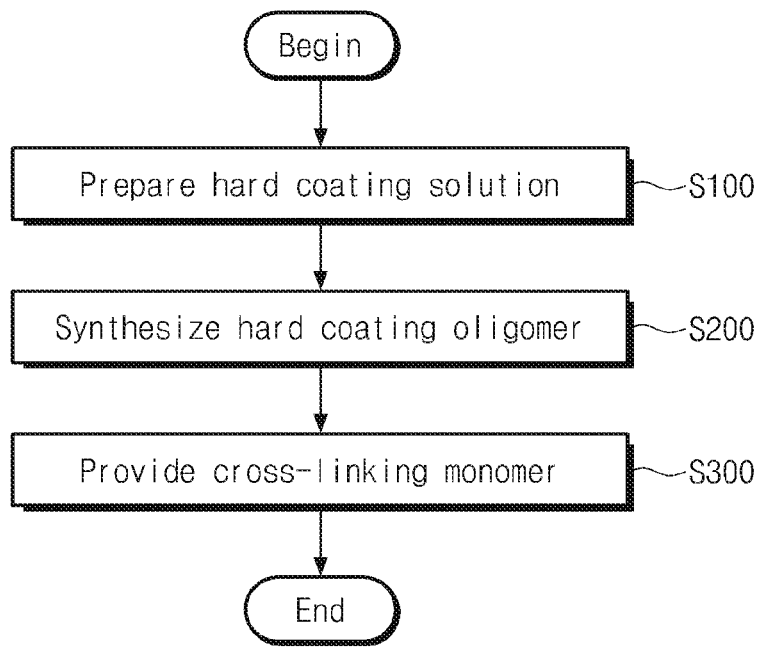
FIGS. 12A-12C are flow charts illustrating methods for preparing a hard coating layer composition according to an embodiment of the present disclosure.
Figure 12B:
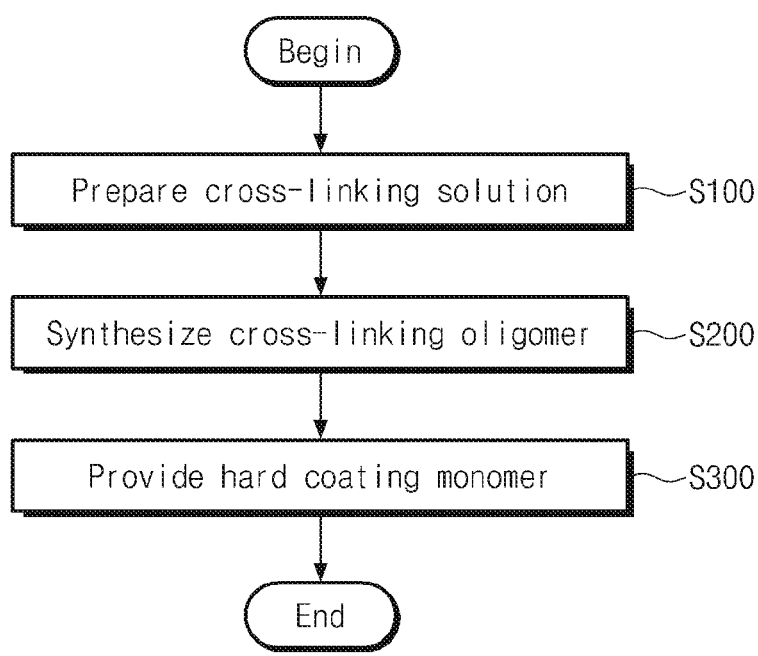
Figure 12C:
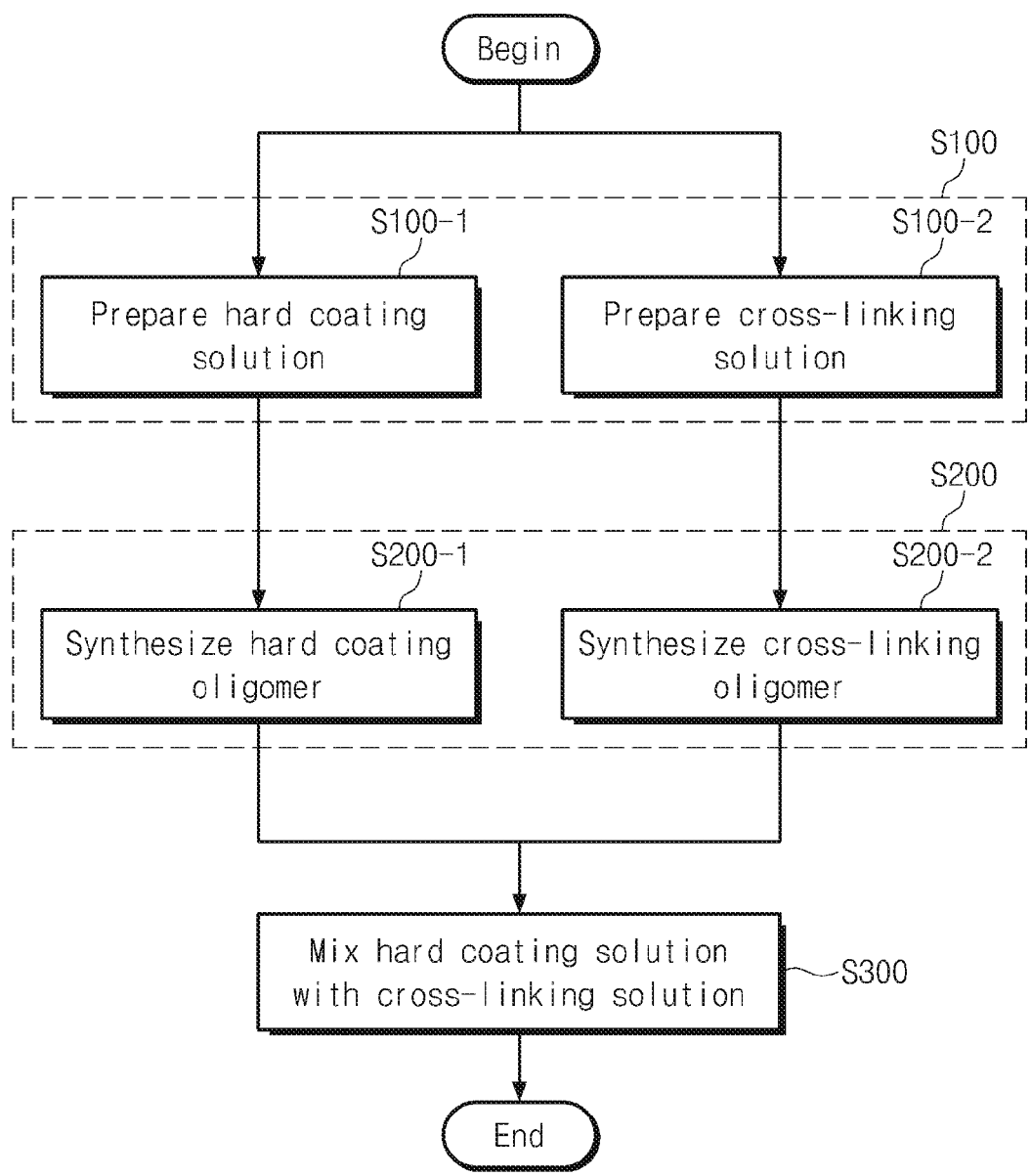

FIGS. 12A-12C are flow charts illustrating methods for preparing a hard coating layer composition according to an embodiment of the present disclosure.

As illustrated in FIG. 12A, first, a hard coating solution is prepared S100. The hard coating solution contains a solvent and hard coating monomers. The solvent may include a ketone-based solvent or an ether-based solvent described with reference to FIG. 8. The hard coating monomers may be identical to Formula 8. The hard coating solution may further include a photoinitiator.

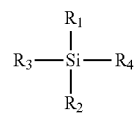

[Formula 8]

In Formula 8, $R_1$ is one of a hydroxy group, a substituted or unsubstituted aryl group having from 6 to 30 carbon atoms for forming a ring, an alkoxy group, a substituted or unsubstituted alkyl group having from 1 to 20 carbon atoms, or a photoinitiated reactive group, in which at least one of the plurality of $R_1$s may be a photoinitiated reactive group. $R_2$ may be one of a hydroxy group, a substituted or unsubstituted aryl group having from 6 to 30 carbon atoms for forming a ring, an alkoxy group, a substituted or unsubstituted alkyl group having from 1 to 20 carbon atoms, or a photoinitiated reactive group. $R_3$ and $R_4$ may be a hydroxy group or an alkoxy group. Here, the alkoxy group may be represented by —OR, and R may be an alkyl group having from 1 to 20 carbon atoms.

Next, the hard coating oligomers are synthesized S200. The hard coating oligomers may be synthesized through a catalytic reaction. A catalyst is provided to the hard coating solution and then the hard coating monomers are reacted. The catalyst may include $Ba(OH)_2 \cdot H_2O$. The type (or kind) of catalyst is not limited thereto, and catalyst materials in which a sol-gel reaction can occur are suitable or sufficient. A basic catalyst such as NaOH or KOH may be used.

Next, cross-linking monomers are provided to the hard coating solution including the synthesized hard coating oligomers S300. Each of the cross-linking monomers is identical to Formula 9.

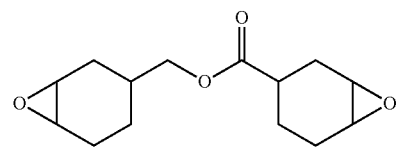

[Formula 9]

The cross-linking monomers are reacted by the catalyst to synthesize the cross-linking oligomers. Thereby, the hard coating composition is prepared. In an embodiment of the present disclosure, the photoinitiator may be provided to the hard coating composition after the cross-linking oligomers have been synthesized.

The hard coating composition may contain 70 wt % to 90 wt % of the hard coating oligomers, 10 wt % to 20 wt % of the cross-linking oligomers, and 1 wt % to 4 wt % of the photoinitiator with respect to 100 wt % of the solid content. Here, solid content indicates the state in which the solvent has been removed during the process of forming the hard coating layer, as described with reference to FIG. 8.

A method for preparing a hard coating composition according to an embodiment of the present disclosure is described with reference to FIG. 12B. First, a cross-linking solution is prepared S100. The cross-linking solution contains a solvent and cross-linking monomers. The solvent may include a ketone-based solvent or an ether-based solvent described with reference to FIG. 8. The cross-linking monomers may be identical to Formula 9. The cross-linking solution may further include a photoinitiator.

Next, the cross-linking oligomers are synthesized S200. The cross-linking oligomers may be synthesized through a catalytic reaction. The catalyst is provided to the cross-linking solution and then the cross-linking monomers are reacted. The catalyst may include Ba(OH)$_2$.H$_2$O. The type (or kind) of catalyst is not limited thereto, and catalyst materials in which a sol-gel reaction can occur are suitable or sufficient.

The cross-linking oligomers may be synthesized as in Table 2. Table 2 displays examples which were synthesized using the monomer of Formula 9. The examples were synthesized using 10 wt % of the Ba(OH)$_2$.H$_2$O catalyst.

TABLE 2

|  | Comparative Example | Example 1 | Example 2 | Example 3 | Example 4 |
|---|---|---|---|---|---|
| h in Formula 4 | 1 | 2-3 | 4-5 | 8-10 | 12 |
| Reaction time (min) | 0 | 0.5 | 1 | 2 | 3 |
| Molecular weight | 300 | 600-900 | 1200-1500 | 2400-3000 | 4000 |

The polymerized amount of the cross-linking monomers may be observed by using FT-IR, GC-MS, GPC, and H$^1$C$^{13}$ NMR. Although not included herein, similar amounts of cross-linking monomers to those of Table 2 were also observed for the synthesis method described with reference to FIG. 12A and the synthesis method to be described below with reference to FIG. 12C.

Next, hard coating monomers are provided to the cross-linking solution including the synthesized cross-linking oligomers S300. The hard coating monomers are reacted by the catalyst to synthesize the hard coating oligomers. Thereby, the hard coating composition is prepared. In an embodiment of the present disclosure, the photoinitiator may be provided to the hard coating composition after the hard coating oligomers have been synthesized.

A method for preparing a hard coating composition according to an embodiment of the present disclosure is described with reference to FIG. 12C. First, a hard coating solution is prepared S100-1, and a cross-linking solution is prepared separate from the hard coating solution S100-2. Next, hard coating oligomers are synthesized S200-1, and cross-linking oligomers are synthesized S200-2. The hard coating oligomers may be synthesized through a catalytic reaction, and the cross-linking oligomers may be synthesized through a catalytic reaction. The hard coating oligomers and the cross-linking oligomers may be independently synthesized but use the same (e.g., substantially the same) catalyst. Next, the hard coating solution and the cross-linking solution are mixed together S300.

A flexible display device according to an embodiment of the present disclosure may include a coating layer having an improved hardness and achieving flexibility. Thus, a window member providing an external surface of the flexible display is not damaged (or substantially not damaged) when subject to an external impact or when bent.

By preparing a cross-linking oligomer by polymerizing cross-linking monomers, manufacturing costs are reduced. By controlling the synthesis time, the length of the cross-linking oligomers may be controlled, and consequently, the flexibility of a hard coating layer may be controlled.

As used herein, the terms "substantially," "about," and similar terms are used as terms of approximation and not as terms of degree, and are intended to account for the inherent deviations in measured or calculated values that would be recognized by those of ordinary skill in the art. Further, the use of "may" when describing embodiments of the present disclosure refers to "one or more embodiments of the present disclosure." As used herein, the terms "use," "using," and "used" may be considered synonymous with the terms "utilize," "utilizing," and "utilized," respectively. Also, the term "exemplary" is intended to refer to an example or illustration.

Also, any numerical range recited herein is intended to include all subranges of the same numerical precision subsumed within the recited range. For example, a range of "1.0 to 10.0" is intended to include all subranges between (and including) the recited minimum value of 1.0 and the recited maximum value of 10.0, that is, having a minimum value equal to or greater than 1.0 and a maximum value equal to or less than 10.0, such as, for example, 2.4 to 7.6. Any maximum numerical limitation recited herein is intended to include all lower numerical limitations subsumed therein, and any minimum numerical limitation recited in this specification is intended to include all higher numerical limitations subsumed therein. Accordingly, Applicant reserves the right to amend this specification, including the claims, to expressly recite any sub-range subsumed within the ranges expressly recited herein.

Although the exemplary embodiments of the present disclosure have been described, it is understood that various changes and modifications can be made by one having ordinary skill in the art within the spirit and scope of the present disclosure as hereinafter claimed.

While the subject matter of the present disclosure has been described in connection with certain embodiments, it is to be understood that the subject matter of the present disclosure is not limited to the disclosed embodiments. Rather, the present disclosure is intended to cover various modifications and equivalents arrangements included within the spirit and scope of the appended claims, and equivalents thereof.

What is claimed is:
1. A method for preparing a hard coating polymer, the method comprising:
 synthesizing hard coating oligomers;
 synthesizing cross-linking oligomers; and
 synthesizing a hard coating polymer by photoreacting the hard coating oligomers and the cross-linking oligomers using a photoinitiator,
 wherein:
 each of the hard coating oligomers is represented by Formula 1,

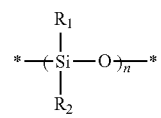

[Formula 1]

where n is from 8 to 150, R$_1$ is one of a hydroxy group, a substituted or unsubstituted aryl group having from 6 to 30 carbon atoms for forming a ring, an alkoxy group, a substituted or unsubstituted alkyl group having from 1 to 20 carbon atoms, or a photoinitiated reactive group, at least one of the plurality of R$_1$s being a photoinitiated reactive group, and R$_2$ is one of a hydroxy group, a substituted or unsubstituted aryl group having from 6 to 30 carbon atoms for forming a ring, an alkoxy group, a substituted or unsubstituted alkyl group having from 1 to 20 carbon atoms, or a photoinitiated reactive group; and each of the cross-linking oligomers is represented by Formula 4,

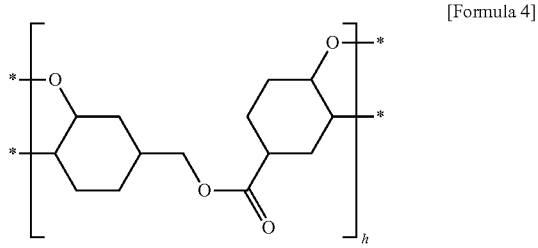

[Formula 4]

wherein, in Formula 4, h is from 2 to 20.

2. The method of claim 1, wherein:
in the synthesizing of the hard coating oligomers, the hard coating oligomers are synthesized by catalytically reacting hard coating monomers; and
in the synthesizing of the cross-linking oligomers, the cross-linking oligomers are synthesized by catalytically reacting cross-linking monomers.

3. The method of claim 2, wherein the same catalyst is used for the synthesizing of the hard coating oligomers and the synthesizing of the cross-linking oligomers.

4. The method of claim 3, wherein the catalyst comprises $Ba(OH)_2 \cdot H_2O$.

5. The method of claim 1, wherein the photoinitiator comprises a first photoinitiator and a second photoinitiator, wherein the first photoinitiator is activated by a first light having a wavelength different from that of a second light that activates the second photoinitiator, and wherein the synthesizing of the hard coating polymer comprises emitting the first light that activates the first photoinitiator and emitting the second light that activates the second photoinitiator.

6. The method of claim 1, wherein with respect to 100 wt % of the hard coating polymer, the hard coating oligomers are 70 wt % to 90 wt %, the cross-linking oligomers are 10 wt % to 20 wt %, and the photoinitiator is 1 wt % to 4 wt %.

7. The method of claim 1, wherein the synthesizing of the hard coating oligomers comprises:
preparing a hard coating solution comprising hard coating monomers and a solvent; and
providing the hard coating solution with a catalyst to synthesize the hard coating oligomers.

8. The method of claim 7, wherein the synthesizing of the cross-linking oligomers comprises providing cross-linking monomers to the hard coating solution in which the hard coating oligomers are synthesized.

9. The method of claim 1, wherein the synthesizing of the cross-linking oligomers comprises:
preparing a cross-linking solution comprising cross-linking monomers and a solvent; and
providing the cross-linking solution with a catalyst to synthesize the cross-linking oligomers.

10. The method of claim 9, wherein the synthesizing of the hard coating oligomers comprises providing hard coating monomers to the cross-linking solution in which the cross-linking oligomers are synthesized.

11. The method of claim 1, wherein the synthesizing of the hard coating oligomers comprises:
preparing a hard coating solution comprising hard coating monomers and a first solvent; and
providing the hard coating solution with a first catalyst to synthesize the hard coating oligomers.

12. The method of claim 11, wherein the synthesizing of the cross-linking oligomers comprises:
preparing a cross-linking solution comprising cross-linking monomers and a second solvent; and
providing the cross-linking solution with a second catalyst to synthesize the cross-linking oligomers.

13. The method of claim 12, wherein each of the first solvent and the second solvent comprises a ketone-based solvent or an ether-based solvent.

14. The method of claim 13, wherein the first catalyst and the second catalyst are the same catalyst.

* * * * *